United States Patent
Park

(10) Patent No.: US 8,541,286 B2
(45) Date of Patent: Sep. 24, 2013

(54) METHODS FOR FABRICATING INTEGRATED CIRCUITS

(75) Inventor: Chang Seo Park, Clifton Park, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 43 days.

(21) Appl. No.: 13/399,674

(22) Filed: Feb. 17, 2012

(65) Prior Publication Data

US 2013/0217204 A1 Aug. 22, 2013

(51) Int. Cl.
*H01L 21/76* (2006.01)
(52) U.S. Cl.
USPC ..... 438/427; 438/275; 438/424; 257/E21.442
(58) Field of Classification Search
USPC .......................................... 438/275, 424, 427
See application file for complete search history.

(56) References Cited

U.S. PATENT DOCUMENTS

| | | | |
|---|---|---|---|
| 8,106,464 B2 * | 1/2012 | Cho et al. | 257/401 |
| 2005/0215014 A1 * | 9/2005 | Ahn et al. | 438/275 |
| 2009/0108353 A1 | 4/2009 | Cho | |
| 2010/0248454 A1 | 9/2010 | Maszara et al. | |
| 2011/0198696 A1 * | 8/2011 | Choi et al. | 257/347 |
| 2011/0237046 A1 * | 9/2011 | Maszara et al. | 438/424 |
| 2011/0263094 A1 * | 10/2011 | Lin et al. | 438/425 |

* cited by examiner

*Primary Examiner* — Alexander Ghyka
(74) *Attorney, Agent, or Firm* — Ingrassia Fisher & Lorenz, P.C.

(57) ABSTRACT

Methods are provided for forming semiconductor devices. One method includes forming a first layer overlying a bulk semiconductor substrate. A second layer is formed overlying the first layer. A first plurality of trenches is etched into the first and second layers. The first plurality of trenches is filled to form a plurality of support structures. A second plurality of trenches is etched into the first and second layers. Portions of the second layer disposed between adjacent trenches of the first and second pluralities of trenches define a plurality of fins. The first layer is etched to form gap spaces between the bulk semiconductor substrate and the plurality of fins. The plurality of fins is supported in position adjacent to the gap spaces by the plurality of support structures. The gap spaces are filled with an insulating material.

20 Claims, 8 Drawing Sheets

METHODS FOR FABRICATING INTEGRATED CIRCUITS

TECHNICAL FIELD

The present invention relates generally to methods for fabricating integrated circuits, and more particularly relates to methods for fabricating integrated circuits with FINFETs using bulk semiconductor substrates.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the dual goals of reducing transistor size while maintaining transistor performance. The FINFET is a three dimensional transistor formed in a thin fin that extends upwardly from a semiconductor substrate. Transistor performance, often measured by its transconductance, is proportional to the width of the transistor channel. In a FINFET, the transistor channel is formed at least along the vertical sidewalls of the fin, so a wide channel, and hence high performance, can be achieved without substantially increasing the area of the substrate surface required by the transistor.

FINFETs have historically been formed using silicon-on-isolator (SOI) substrates. A SOI substrate includes a silicon material layer overlying an insulator layer, such as a silicon oxide layer. Using the SOI substrate, the conductive fins are formed from the silicon material layer while the insulator layer provides clear demarcation of the base of the fins to electrically isolate the FINFETs. Electrical isolation such as between adjacent FINFETs is important for reducing or minimizing electrical current leakage which is a parasitic effect that degrades performance of the integrated circuit.

Bulk semiconductor substrates, such as bulk silicon substrates, are less expensive than SOI substrates, and FINFETs can also be fabricated using bulk semiconductor substrates. A bulk semiconductor substrate is, for example, a monolithic block of single crystal silicon. When a bulk semiconductor substrate is used to fabricate FINFETs, there is no inherent isolation layer and thus no clear demarcation of the base of the fins to electrically isolate the FINFETs. Therefore, an isolation methodology is needed to reduce or minimize electrical current leakage, e.g., electrical current leakage between adjacent FINFETs. Unfortunately, conventional isolation methodologies for FINFETs that are formed using bulk semiconductor substrates are complex, inherently difficult to control, and/or require uniform thickness of the fins.

Accordingly, it is desirable to provide methods for fabricating an integrated circuit with FINFETs using a bulk semiconductor substrate in which the FINFETs are electrically isolated to reduce or minimize current leakage. Moreover, it is desirable to provide methods for fabricating an integrated circuit with FINFETs using a bulk semiconductor substrate and which include improved isolation methodologies for the FINFETs. Furthermore, other desirable features and characteristics of the present invention will become apparent from the subsequent detailed description and the appended claims, taken in conjunction with the accompanying drawings and the foregoing technical field and background.

BRIEF SUMMARY

Methods for fabricating integrated circuits are provided herein. In accordance with an exemplary embodiment, a method for fabricating an integrated circuit includes forming a first layer of a first semiconductor material overlying a bulk semiconductor substrate that is formed of a second semiconductor material. A second layer of a third semiconductor material is formed overlying the first layer. A first plurality of trenches is etched into the first and second layers. The first plurality of trenches is filled with a structure forming material to form a plurality of support structures. A second plurality of trenches is etched into the first and second layers. Portions of the second layer disposed between adjacent trenches of the first and second pluralities of trenches define a plurality of fins. The first layer is etched to form gap spaces between the bulk semiconductor substrate and the plurality of fins. The plurality of fins is supported in position adjacent to the gap spaces by the plurality of support structures. The gap spaces are filled with an insulating material.

In accordance with another exemplary embodiment, a method for fabricating an integrated circuits is provided. The method includes forming a first layer of a first semiconductor material overlying a bulk semiconductor substrate that is formed of a second semiconductor material. A second layer of a third semiconductor material is formed overlying the first layer. A first plurality of trenches is etched through the first and second layers into the bulk semiconductor substrate. The first plurality of trenches is filled with a structure forming material to form a plurality of support structures extending from the bulk semiconductor substrate through the first and second layers. A second plurality of trenches is etched through the first and second layers into the bulk semiconductor substrate. The second plurality of trenches is arranged alternately with the first plurality of trenches. Portions of the second layer disposed between adjacent trenches of the first and second plurality of trenches define a plurality of fins. The first layer is etched to form gap spaces between the bulk semiconductor substrate and the plurality of fins. The plurality of fins is supported in position adjacent to the gap spaces by the plurality of support structures. The gap spaces are filled with an insulating material.

In accordance with another exemplary embodiment, a method for fabricating an integrated circuits is provided. The method includes epitaxially growing a first layer of silicon germanium overlying a bulk silicon substrate. A second layer of silicon is epitaxially grown overlying the first layer. A first plurality of trenches is etched through the first and second layers into the bulk silicon substrate. The first plurality of trenches is filled with a first oxide material to form a plurality of support structures extending from the bulk silicon substrate through the first and second layers. A second plurality of trenches is etched through the first and second layers into the bulk silicon substrate. The second plurality of trenches is arranged alternately with the first plurality of trenches. Portions of the second layer disposed between adjacent trenches of the first and second plurality of trenches define a plurality of fins. The first layer is etched to form gap spaces between the bulk silicon substrate and the plurality of fins. The plurality of fins is supported in position adjacent to the gap spaces by the plurality of support structures. The gap spaces are filled with a second oxide material.

BRIEF DESCRIPTION OF THE DRAWINGS

The present invention will hereinafter be described in conjunction with the following drawing figures, wherein like numerals denote like elements.

FIGS. 2-20 illustrate the integrated circuit in cross sectional view during various stages of its fabrication. FIG. 21 illustrates the integrated circuit in perspective view at a later stage of its fabrication.

DETAILED DESCRIPTION

The following Detailed Description is merely exemplary in nature and is not intended to limit the invention or the application and uses of the invention. Furthermore, there is no intention to be bound by any theory presented in the preceding background or the following detailed description.

Integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term used herein refers to any device that includes a conductive gate electrode (whether metal or other conductive material) that is positioned over a gate insulator (whether oxide or other insulator) which, in turn, is positioned over a semiconductor substrate. One type of MOS transistor used in the design of ICs is a FINFET, which can be fabricated as a P-channel transistor or as a N-channel transistor, and can also be fabricated with or without mobility enhancing stress features. A circuit designer can mix and match device types, using P-channel and N-channel, FINFET and other types of MOS transistors, stressed and unstressed, to take advantage of the best characteristics of each device type as they best suit the circuit being designed.

Figure 1:
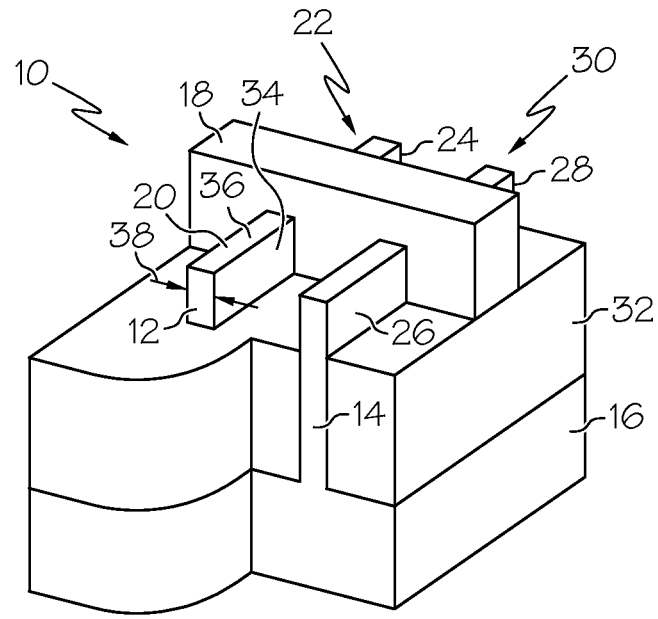
FIG. 1 illustrates a FINFET in a partially cut away perspective view.

The following brief explanation is provided to identify some of the unique features of FINFETs. FIG. 1 illustrates, in a cut away perspective view, a portion of a FINFET integrated circuits (IC) 10. As illustrated, the IC 10 includes two fins 12 and 14 that are formed from and extend upwardly from a bulk semiconductor substrate 16. A gate electrode 18 overlies the two fins 12 and 14 and is electrically insulated from the fins 12 and 14 by a gate insulator (not illustrated). An end 20 of the fin 12 is appropriately impurity doped to form a source of a FINFET 22, and an end 24 of the fin 12 is appropriately impurity doped to form a drain of the FINFET 22. Similarly, the ends 26 and 28 of the fin 14 form the source and drain, respectively, of another FINFET 30.

The illustrated portion of IC 10 thus includes two FINFETs 22 and 30 having a common gate electrode 18. In another configuration, if the ends 20 and 26 that form the sources are electrically coupled together and the ends 24 and 28 that form the drains are electrically coupled together, the structure would be a two-fin FINFET having twice the gate width of either FINFET 22 or 30. An oxide layer 32 forms electrical isolation between the fins 12 and 14 and between adjacent devices as is needed for the circuit being implemented. The channel of the FINFET 22 extends along a sidewall 34 of the fin 12 beneath the gate electrode 18, along a top 36 of the fin 12, as well as along an opposite sidewall not visible in this perspective view. The advantage of the FINFET structure is that although the fin 12 has only the narrow width represented by the arrows 38, the channel has a width represented by at least twice the height of the fin 12 above the oxide layer 32. The channel width thus can be much greater than fin width.

FIGS. 2-21 illustrate methods for forming an IC 40 in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portion of the IC 40 at a later stage of fabrication as shown in FIG. 21 includes only a single FINFET 42, although those of skill in the art will recognize that an actual IC could include a large number of such transistors. FINFET 42 is similar to FINFETs 22 and 30 described above with the exception that FINFET 42 has a clear demarcation of the base 92 of its fin 88 with an underlying isolation layer as will be described in further detail below to enhance electrical isolation and to reduce or minimize current leakage. Various steps in the manufacture of ICs are well known and so, in the interest of brevity, many conventional steps will only be mentioned briefly herein or will be omitted entirely without providing the well known process details.

Figure 2:
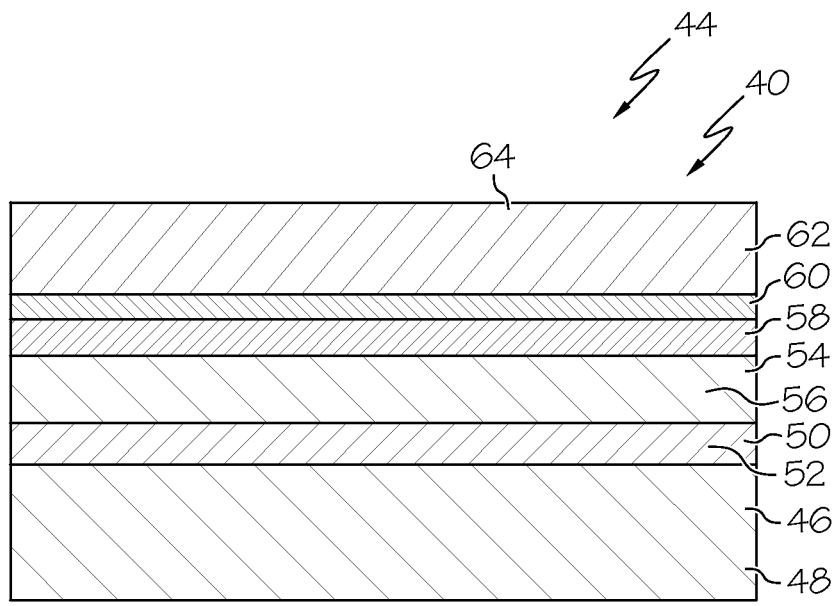
FIGS. 2-21 illustrate methods for fabricating integrated circuits in accordance with various embodiments.

FIG. 2 illustrates, in cross sectional view, a portion of the IC 40 at an early stage of fabrication. The illustrated portion includes a device area 44 in which FINFETs such as FINFET 42 (see FIG. 21) will be fabricated. The IC 40 is fabricated on a bulk semiconductor substrate 46 that is formed of a semiconductor material 48. In an exemplary embodiment, the bulk semiconductor substrate 46 is a bulk silicon substrate and the semiconductor material 48 includes silicon. For example, the bulk silicon substrate can be formed from relatively pure silicon, silicon admixed with germanium or carbon, or silicon admixed with some other semiconductor material(s) commonly used in the fabrication of integrated circuits. Alternatively, the semiconductor material 48 of the bulk semiconductor substrate 46 can be germanium, gallium arsenide, or the like. The semiconductor material 48 need not be doped, although it may be very lightly doped as either N-type or P-type, without impacting the manufacturing process described herein.

A first layer 50 of a semiconductor material 52, such as silicon germanium, is formed overlying the bulk semiconductor substrate 46. In an exemplary embodiment, the first layer 50 is formed by epitaxially growing silicon germanium on the bulk semiconductor substrate 46 in accordance with known process techniques. In one example, the first layer 50 is formed by epitaxially growing silicon germanium that contains of from about 30 to about 40 weight percent of germanium. In an exemplary embodiment, the first layer 50 has a thickness of from about 15 to about 20 nm. A second layer 54 of a semiconductor material 56, such as a silicon-containing material, is formed overlying the first layer 50. In an exemplary embodiment, the second layer 54 is formed by epitaxially growing silicon on the first layer 50 in accordance with known process techniques. In one example, the second layer 54 is formed by epitaxially growing substantially pure silicon to form the second layer 54 having a thickness of from about 50 to about 80 nm. As will be discussed in further detail below, the second layer 54 is used to form the fins) that define the FINFET(s) 42 of the IC 40.

As illustrated, the process continues by forming a first hard mask layer 58 overlying the second layer 54, and a second hard mask layer 60 overlying the first hard mask layer 58. In an exemplary embodiment, the first hard mask layer 58 is formed by depositing silicon nitride on the second layer 54, and the second hard mask layer 60 is formed by depositing silicon oxide on the first hard mask layer 58. A sacrificial layer 62 of a semiconductor material 64 is formed overlying the first and second hard mask layers 58 and 60. In an exemplary embodiment, the semiconductor material 64 is amorphous carbon. Well known process techniques, such as chemical vapor deposition and/or the like, may be used to form the first and second hard mask layers 58 and 60 and the sacrificial layer 62.

Figure 3:
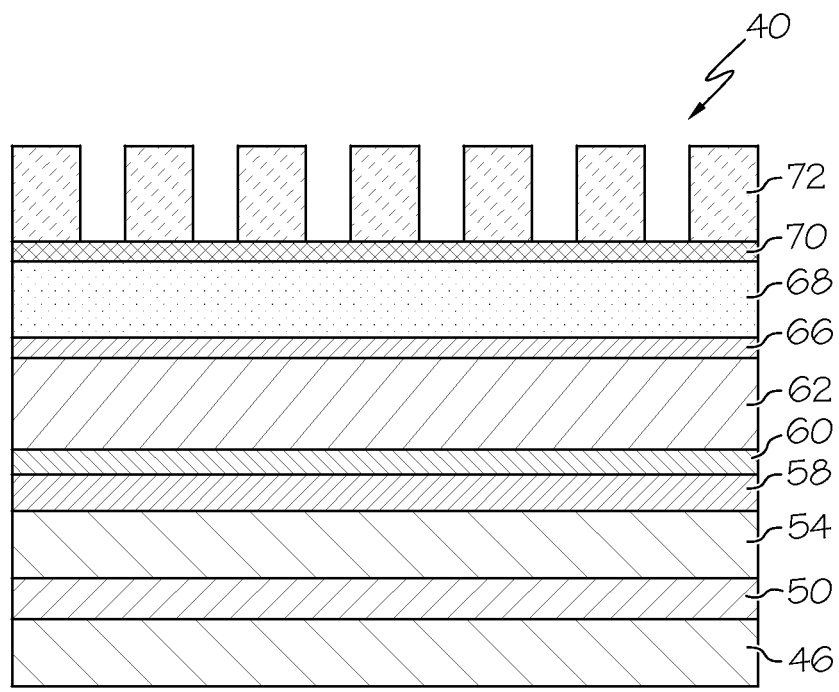
Figure 4:
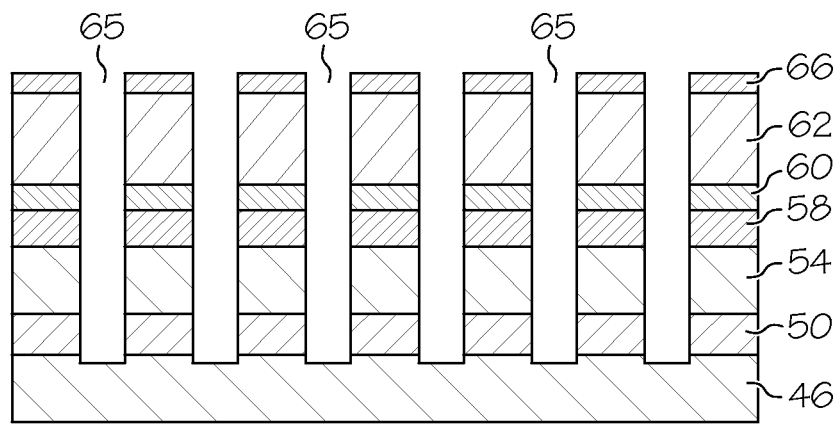

FIGS. 3-4 illustrate, in cross sectional views, the IC 40 at further advanced fabrication stages in accordance with an exemplary embodiment. As shown, a first plurality of trenches 65 are formed by anisotropically etching through the sacrificial layer 62, the first and second hard mask layers 58 and 60, the first and second layers 52 and 54, and into the bulk semiconductor substrate 46 in accordance with known process techniques. In one example, the first plurality of trenches 65 are formed by depositing a nitride hard mask layer 66, an organic development layer 68, and an arc layer 70. A patterned photoresist layer 72 is formed and used as an etch mask to etch the underlying layers, for example by reactive ion etching (RIE).

Figure 5:
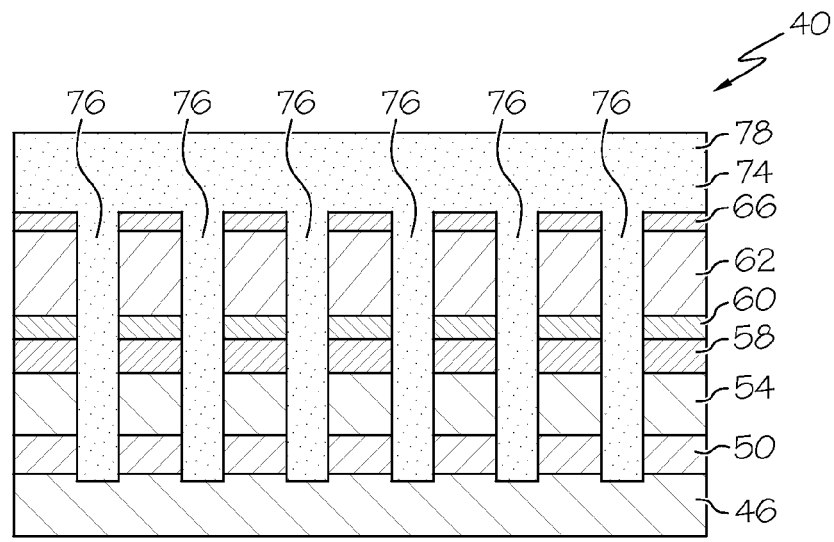
Figure 6:
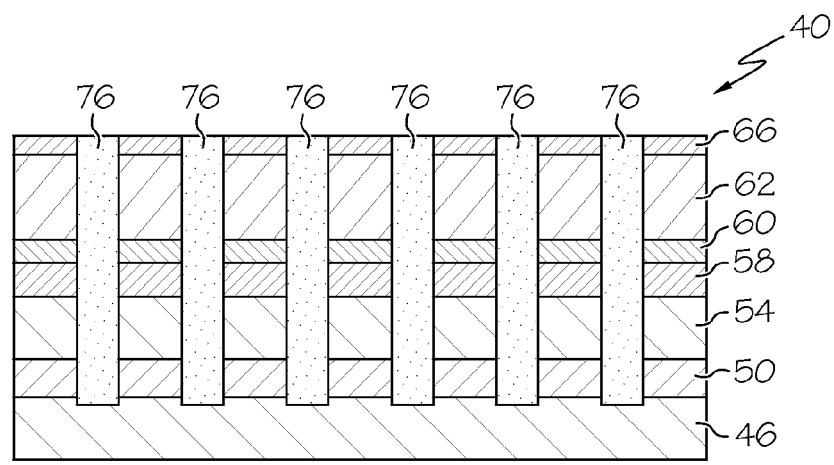
Figure 7:
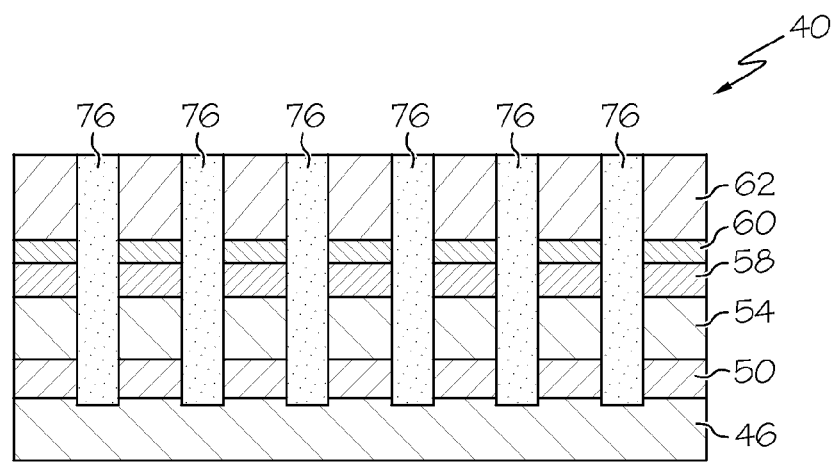
Figure 8:
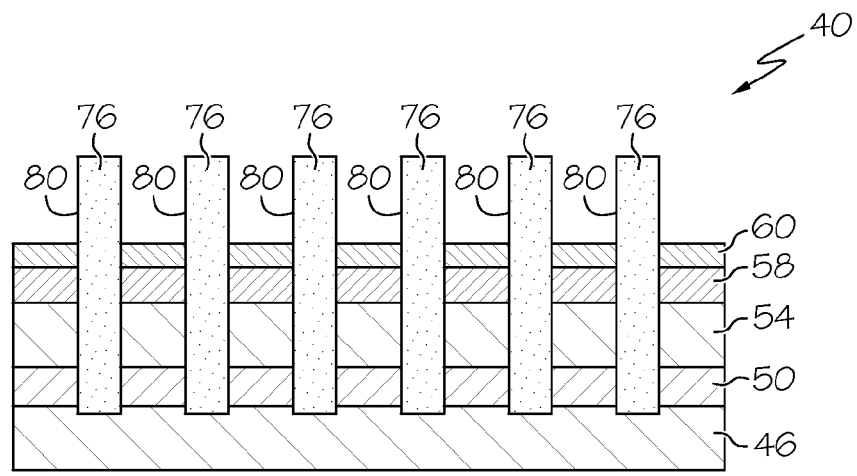
Figure 9:
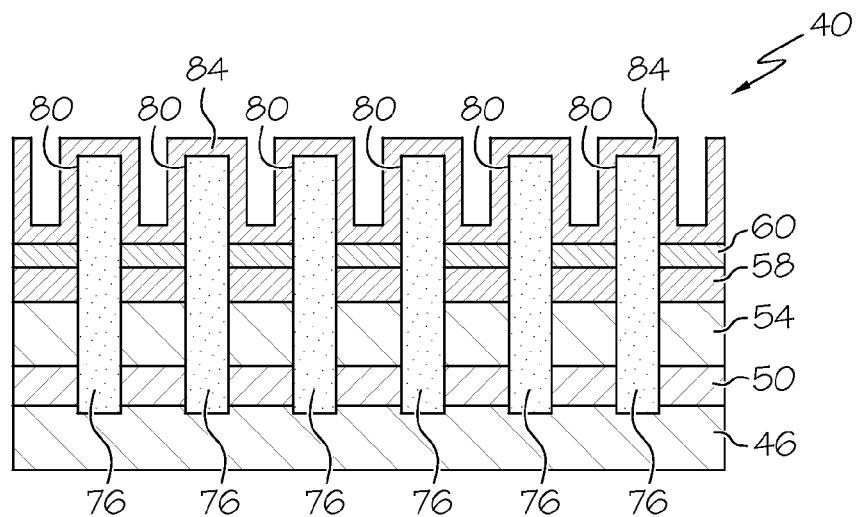
Figure 10:
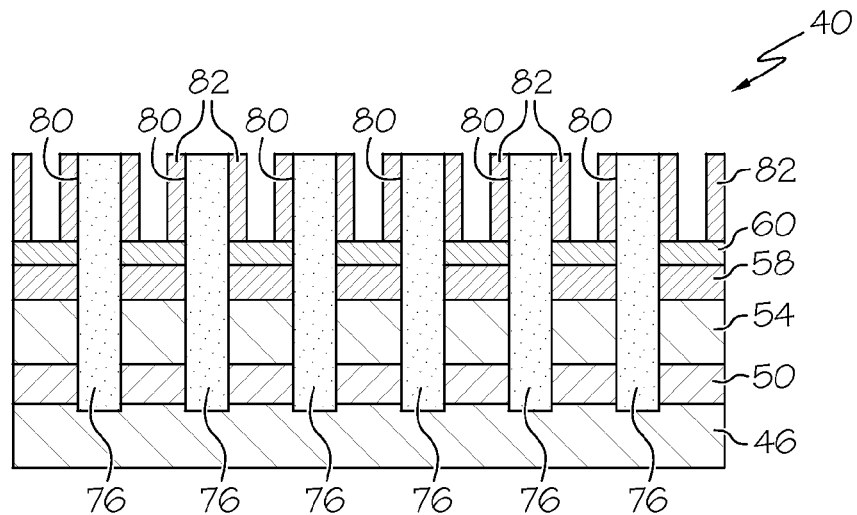

FIGS. 5-7 illustrate, in cross sectional views, the IC 40 at further advanced fabrication stages in accordance with an exemplary embodiment. A structure forming material 74 is deposited to fill the first plurality of trenches 65 and form a plurality of support structures 76 that extend from the bulk semiconductor substrate 46 through the first plurality of trenches 65. In an exemplary embodiment, the structure forming material 74 is an oxide material, such as, for example, silicon oxide. The first plurality of trenches 65 may be filled with the structure forming material 74 using a flowable oxide deposition process, spin on glass process, or any other suitable deposition process known to those skilled in the art. Optionally, the IC 40 may be exposed to an annealing temperature of from about 300 to about 500° C. to facilitate filling the first plurality of trenches 65 with the structure forming material 74. An excess portion 78 of the structure forming material 74 that overlies the nitride hard mask layer 66 is then removed via CMP or the like, and the nitride hard mask layer 66 is stripped via a wet or dry etching process or the like to expose the top portions of the sacrificial layer 62 and the plurality of support structures 76.

Figure 11:
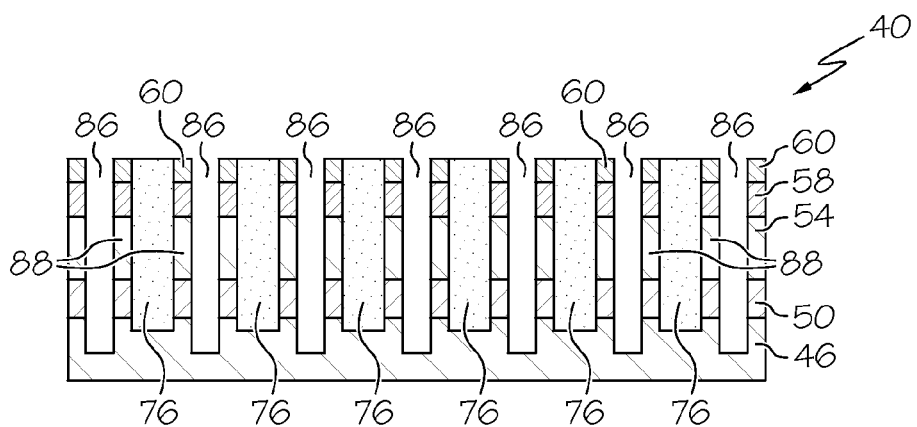

FIGS. 8-11 illustrate, in cross sectional views, the IC 40 at further advanced fabrication stages in accordance with an exemplary embodiment. The sacrificial layer 62 is removed, e.g., via a dry etching process such as RIE or the like, to expose the upper portions 80 of the plurality of support structures 76. Sidewall spacers 82 are formed on the upper portions 80 of the plurality of support structures 76 by depositing a nitride layer 84 overlying the upper portions 80 of the support structures 76 and the second hard mask layer 60, and anisotropically etching the nitride layer 84. Then using the plurality of support structures 76 and the sidewall spacers 82 as an etch mask, a second plurality of trenches 86 are formed by etched through the first and second hard mask layers 58 and 60, the first and second layers 50 and 54, and into the bulk semiconductor substrate 46. The sidewall spacers 82 and the upper portions 80 of the plurality of support structures 76 are then removed. As illustrated in FIG. 11, the second plurality of trenches 86 exposes the first layer 50. In an exemplary embodiment, the second plurality of trenches 86 are arranged alternately or interleafingly with the first plurality of trenches 65 such that portions of the second layer 54 disposed between adjacent trenches of the first and second plurality of trenches 65 and 86 define a plurality of fins 88.

Figure 12:
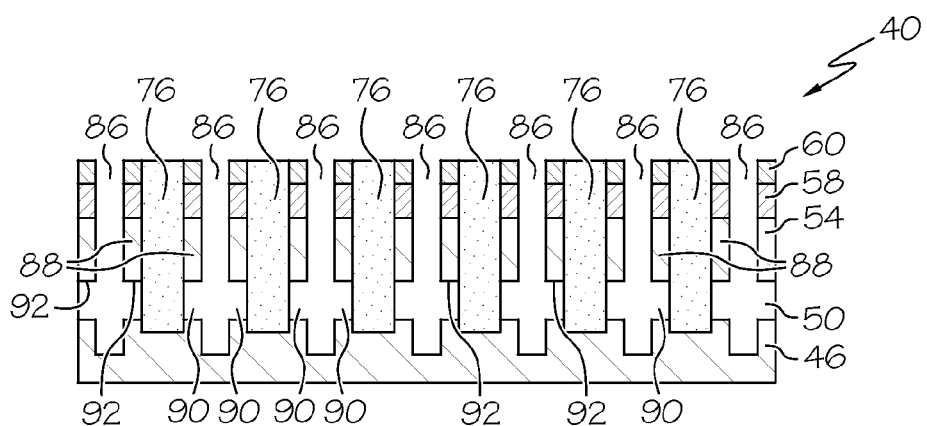
Figure 13:
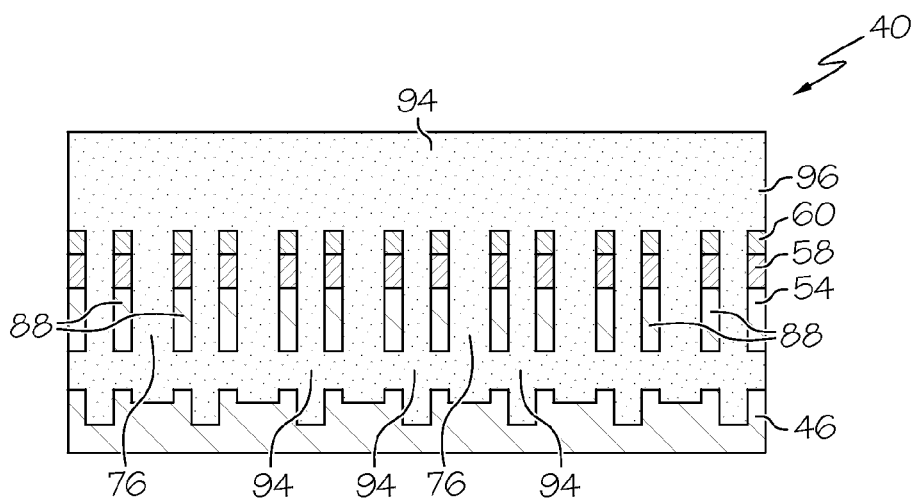
Figure 14:
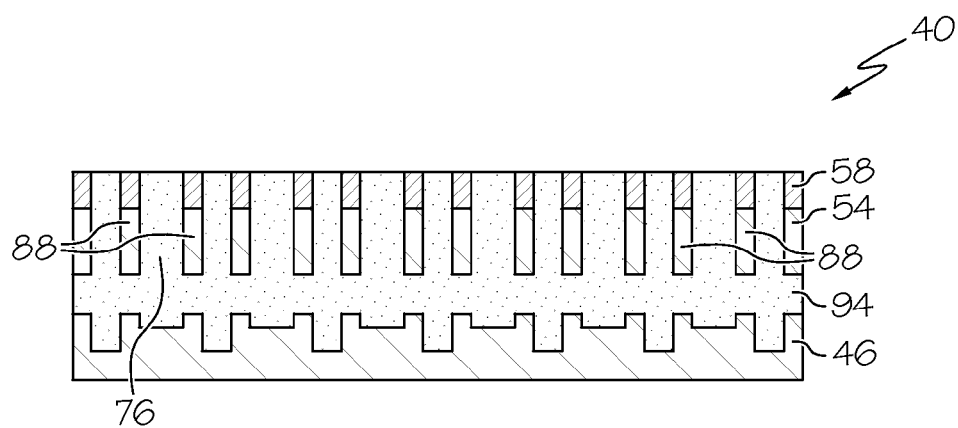

FIG. 12 illustrates, in cross sectional view, the IC 40 at a further advanced fabrication stage in accordance with an exemplary embodiment. The first layer 50 is removed via etching to form gap spaces 90 between the bulk semiconductor substrate 46 and the fins 88. In particular and as shown, the gap spaces 90 form a clear boundary space between the base 92 of the fins 88 and the bulk semiconductor substrate 46. The fins 88, which are suspended over or adjacent to the gap spaces 90, are supported in position by the support structures 76. In an exemplary embodiment, the first layer 50 is etched using an etchant that etches the SiGe material of the first layer 50 in preference to the silicon material of the bulk semiconductor substrate 46 and the fins 88, such as a standard clean 2 solution (SC-2) that includes deionized water, hydrochloric acid, and hydrogen peroxide as is well known in the art. Other etchants known to those skilled in the art may also be used to remove the first layer 50.

Figure 15:
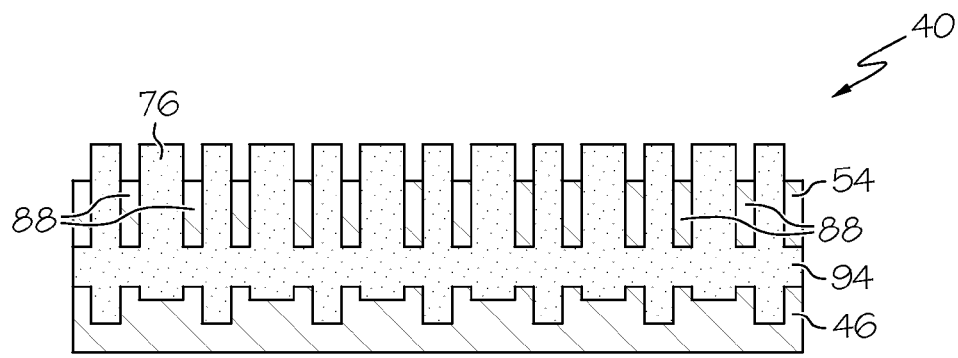
Figure 16:
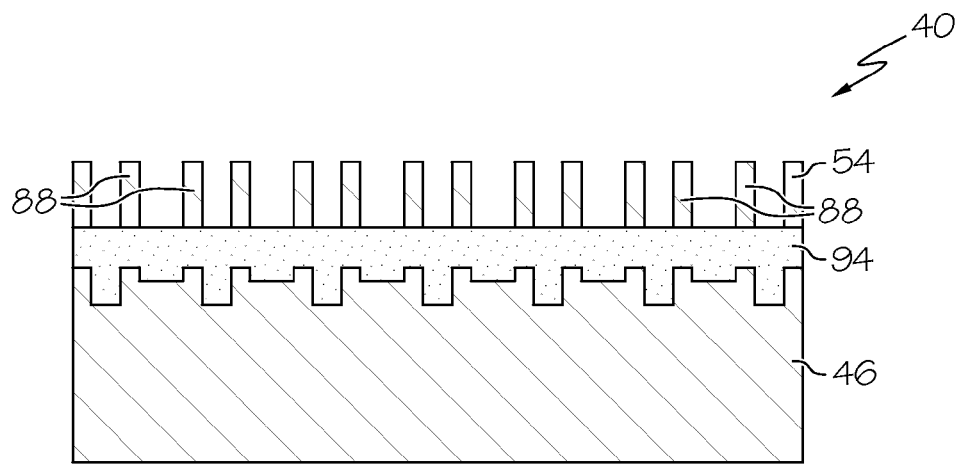
Figure 17:
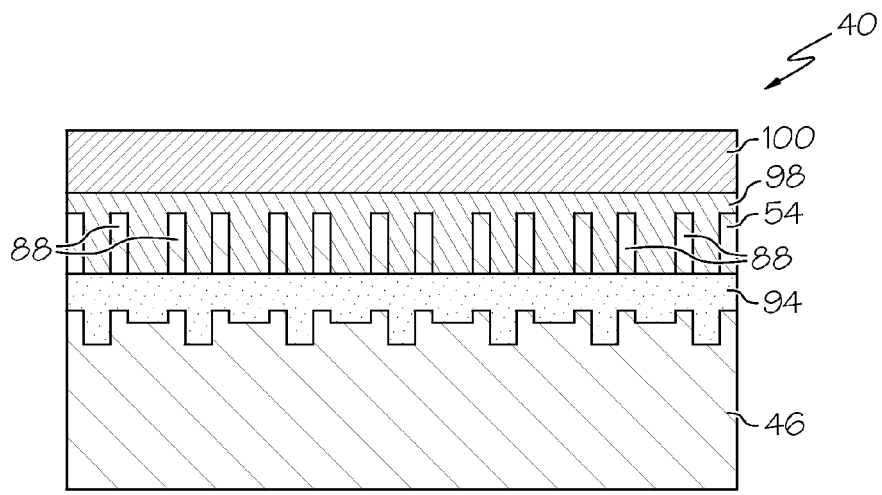
Figure 18:
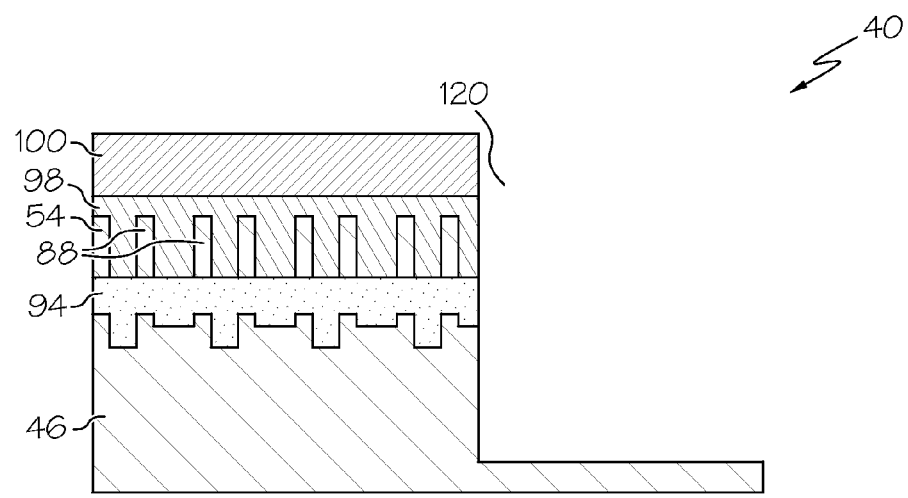
Figure 19:
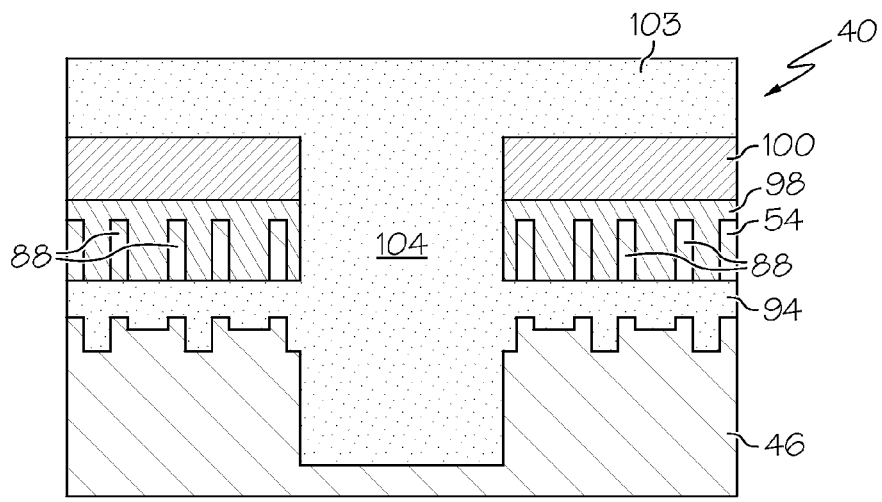

FIGS. 13-16 illustrate, in cross sectional views, the IC 40 at further advanced fabrication stages in accordance with an exemplary embodiment. An insulating material 94, such as an oxide material, e.g., silicon oxide, is deposited to fill the gap spaces 90 and the second plurality of trenches 86. In particular, the insulating material 94 fills in the clear boundary space between the base 92 of the fins 88 and the bulk semiconductor substrate 46, providing a clear demarcation of the base 92 of the fins 88. The gap spaces 90 and the second plurality of trenches 86 may be filled with the insulating material 94 using a flowable oxide deposition process, spin on glass process, or any other deposition process known to those skilled in the art. An excess portion 96 of the insulating material 94 and the second hard mask layer 60 are then removed via CMP, a wet or dry etching process, or a combination of CMP and a wet or dry etching process(es) using the first hard mask layer 58 as a stop layer. The process continues by removing the first hard mask layer 58 as shown in FIG. 15, and then removing portions of the insulating material 94 and the support structures 76 to expose the fins 88 as shown in FIG. 16.

Figure 20:
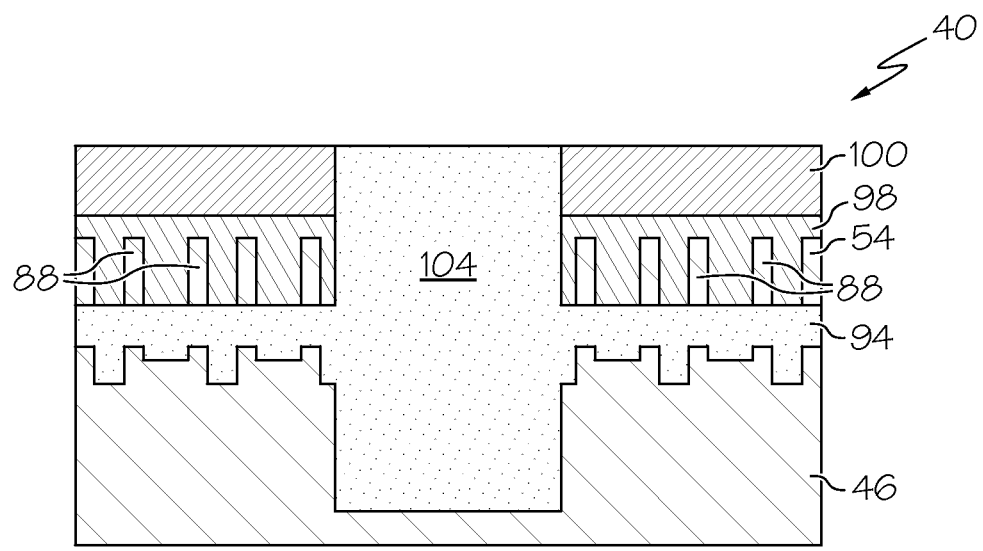
Figure 21:
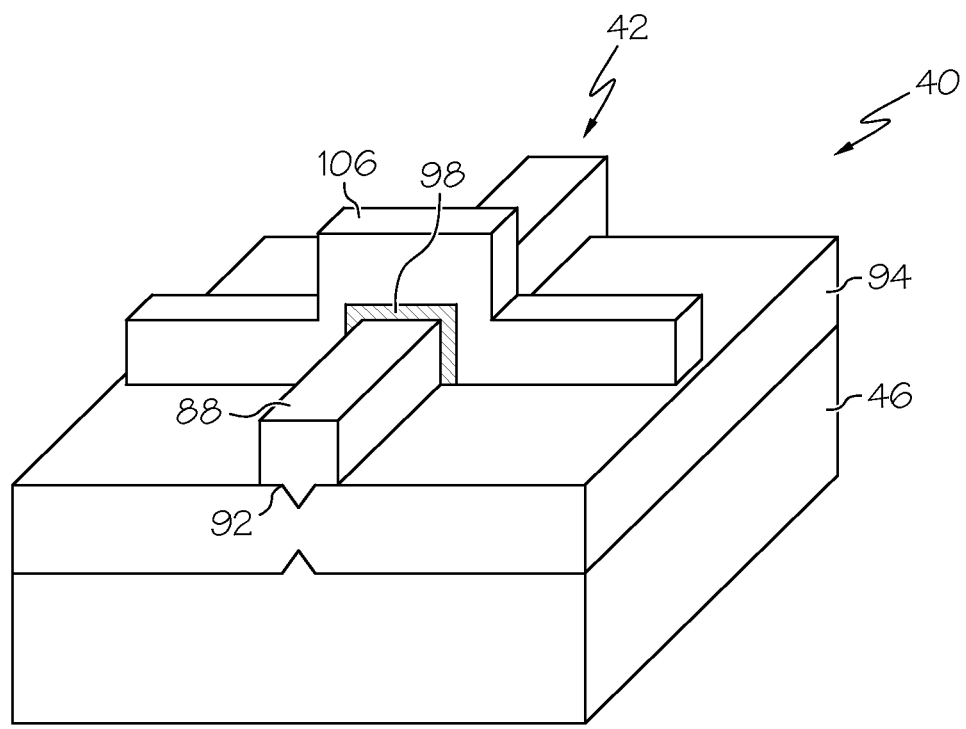

FIGS. 17-20 illustrate, in cross sectional views, the IC 40 at further advanced fabrication stages in accordance with an exemplary embodiment. A dummy oxide layer 98, such as silicon oxide, is deposited overlying the fins 88, and a nitride hard mask layer 100 is deposited overlying the dummy oxide layer 98. A STI trench 102 is etched through the dummy oxide and nitride hard mask layers 98 and 100 and into the bulk semiconductor substrate 46. The dummy oxide layer 98, the nitride hard mask layer 100, and the STI trench 102 may be formed in accordance with known process techniques. An STI fill material 104, e.g., an oxide material such as silicon oxide, is deposited to fill the STI trench 102, and then an excess portion 103 of the STI fill material 104 overlying the nitride hard mask layer 100 is removed by CMP or the like as illustrated in FIG. 20.

FIG. 21 illustrates, in perspective view, the IC 40 at a further advanced fabrication stage in accordance with an exemplary embodiment. The nitride hard mask layer 100 is removed and the dummy oxide layer 92 is selectively etched, and then a gate electrode 106 is formed overlying and orthogonal to the fins) 88. For the sake of brevity, the process details for the formation of the gate electrode 106 are omitted, as they are conventional FINFET fabrication steps known to those skilled in the art. As illustrated, the layer including the insulating material 94 provides a clear demarcation of the base 92 of the fin 88 to electrically isolate the FINFET 42 and to reduce or minimize electrical current leakage.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit comprising:
    forming a first layer of a first semiconductor material overlying a bulk semiconductor substrate that is formed of a second semiconductor material;
    forming a second layer of a third semiconductor material overlying the first layer;
    etching a first plurality of trenches into the first and second layers;
    filling the first plurality of trenches with a structure forming material to form a plurality of support structures;
    etching a second plurality of trenches into the first and second layers, wherein portions of the second layer disposed between adjacent trenches of the first and second plurality of trenches define a plurality of fins;
    etching the first layer to form gap spaces between the bulk semiconductor substrate and the plurality of fins, wherein the plurality of fins are supported in position adjacent to the gap spaces by the plurality of support structures; and
    filling the gap spaces with an insulating material.

2. The method of claim 1, wherein forming the first layer comprises providing the bulk semiconductor substrate of the second semiconductor material that comprises silicon.

3. The method of claim 1, wherein forming the first layer comprises forming the first layer of the first semiconductor material that comprises silicon germanium.

4. The method of claim 1, wherein forming the second layer comprises forming the second layer of the third semiconductor material that comprises silicon.

5. The method of claim 1, wherein etching the first plurality of trenches comprises etching through the first and second layers into the bulk semiconductor substrate to form the first plurality of trenches.

6. The method of claim 1, wherein filling the first plurality of trenches comprises forming the plurality of support structures coupled to the bulk semiconductor substrate.

7. The method of claim 1, wherein filling the first plurality of trenches comprises filling the first plurality of trenches with the structure forming material that comprises an oxide material.

8. The method of claim 1, wherein etching the second plurality of trenches comprises etching through the first and second layers into the bulk semiconductor substrate to form the second plurality of trenches.

9. The method of claim 1, wherein filling the gap spaces comprises filling the gap spaces with the insulating material that comprises silicon oxide.

10. The method of claim 1, wherein filling the gap spaces comprises filling the second plurality of trenches with the insulating material.

11. The method of claim 10, further comprising:
    removing portions of the insulating material and the plurality of support structures to expose the plurality of fins.

12. The method of claim 1, further comprising:
    forming at least one hard mask layer of a hard mask material overlying the second layer; and
    forming a sacrificial layer of a fourth semiconductor material overlying the at least one hard mask layer, and wherein etching the first plurality of trenches comprises etching through the sacrificial layer and the at least one hard mask layer and into the first and second layers to form the first plurality of trenches.

13. The method of claim 12, further comprising:
    etching the sacrificial layer to expose upper portions of the plurality of support structures; and
    forming sidewall spacers on the upper portions of the plurality of support structures, and wherein etching the second plurality of trenches comprises etching the second plurality of trenches using the plurality of support structures and the sidewall spacers as an etch mask.

14. The method of claim 12, wherein forming the sacrificial layer comprises forming the sacrificial layer of the fourth semiconductor material that comprises amorphous carbon.

15. A method for fabricating an integrated circuit comprising:
    forming a first layer of a first semiconductor material overlying a bulk semiconductor substrate that is formed of a second semiconductor material;
    forming a second layer of a third semiconductor material overlying the first layer;
    etching a first plurality of trenches through the first and second layers into the bulk semiconductor substrate;
    filling the first plurality of trenches with a structure forming material to form a plurality of support structures extending from the bulk semiconductor substrate through the first and second layers;
    etching a second plurality of trenches through the first and second layers into the bulk semiconductor substrate, wherein the second plurality of trenches are arranged alternately with the first plurality of trenches, and wherein portions of the second layer disposed between adjacent trenches of the first and second plurality of trenches define a plurality of fins;
    etching the first layer to form gap spaces between the bulk semiconductor substrate and the plurality of fins, wherein the plurality of fins are supported in position adjacent to the gap spaces by the plurality of support structures; and
    filling the gap spaces with an insulating material.

16. The method of claim 15, further comprising:
    forming shallow trench isolation interposed between the plurality of fins.

17. The method of claim 16, wherein filling the gap spaces comprises filling the second plurality of trenches with the insulating material, and wherein the method further comprises:
    removing portions of the insulating material and the plurality of support structures to expose the plurality of fins prior to forming the shallow trench isolation.

18. The method of claim 15, wherein forming the shallow trench isolation comprises:
    forming a dummy oxide layer overlying the plurality of fins subsequent to removing the portions of the insulating material and the plurality of support structures;
    forming a hard mask layer overlying the dummy oxide layer;

etching a STI trench through the hard mask and dummy oxide layers into the bulk semiconductor substrate; and depositing an STI fill material into the STI trench.

19. The method of claim 18, further comprising:

removing the hard mask layer; and forming a gate structure overlying at least one of the plurality of fins.

20. A method for fabricating an integrated circuits comprising:

epitaxially growing a first layer of silicon germanium overlying a bulk silicon substrate;

epitaxially growing a second layer of silicon overlying the first layer;

etching a first plurality of trenches through the first and second layers into the bulk silicon substrate;

filling the first plurality of trenches with a first oxide material to form a plurality of support structures extending from the bulk silicon substrate through the first and second layers;

etching a second plurality of trenches through the first and second layers into the bulk silicon substrate, wherein the second plurality of trenches are arranged alternately with the first plurality of trenches, and wherein portions of the second layer disposed between adjacent trenches of the first and second plurality of trenches define a plurality of fins;

etching the first layer to form gap spaces between the bulk silicon substrate and the plurality of fins, wherein the plurality of fins are supported in position adjacent to the gap spaces by the plurality of support structures; and filling the gap spaces with a second oxide material.

* * * * *